United States Patent [19]

Eaton et al.

[11] Patent Number: 4,592,081
[45] Date of Patent: May 27, 1986

[54] ADAPTIVE X-RAY LITHOGRAPHY MASK

[75] Inventors: Steven G. Eaton, Palo Alto; Graham J. Siddall, Woodside, both of Calif.

[73] Assignee: Varian Associates, Inc., Palo Alto, Calif.

[21] Appl. No.: 578,912

[22] Filed: Feb. 10, 1984

[51] Int. Cl.$^4$ .............................................. G21K 5/08
[52] U.S. Cl. ................................. 378/34; 378/205; 250/491.1
[58] Field of Search ............... 250/491.1; 378/34, 35, 378/205

[56] References Cited

U.S. PATENT DOCUMENTS

| 4,385,434 | 5/1983 | Zehnpfenning et al. | 378/34 |
| 4,475,223 | 10/1984 | Taniguchi et al. | 378/34 |
| 4,516,253 | 5/1985 | Novak | 378/34 |
| 4,525,852 | 6/1985 | Rosenberg | 378/34 |

OTHER PUBLICATIONS

R. V. Jones, "Some Uses of Elasticity in Instrument Design," *Journal of Scientific Instruments*, vol. 39, May 1962, pp. 193–203.

M. G. Natrella, *Experimental Statistics*, National Bureau of Standards Handbook 91, Washington: U.S. Government Printing Office, Chapter 6, Aug. 1963.

*Primary Examiner*—Carolyn E. Fields
*Attorney, Agent, or Firm*—Stanley Z. Cole; William R. McClellan

[57] ABSTRACT

Provided is an apparatus for improving alignment accuracy by distorting in a controlled manner an X-ray lithographic mask to compensate for mask distortions induced primarily by thermally induced clamping effects in E-beam and X-ray exposure systems. A system of additional alignment sensors is used to provide localized misalignment information. This information is then used to provide feedback to a servo system which in turn activates electromechanically translatable clamps which distort the X-ray mask so as to minimize misalignment over the exposure field.

10 Claims, 5 Drawing Figures

ADAPTIVE X-RAY LITHOGRAPHY MASK

BACKGROUND

This invention relates to an X-ray mask alignment scheme and more particularly to controlling X-ray mask distortion for integrated circuit pattern generation.

In a standard X-ray mask alignment system small changes in the nominal gap between the mask and an integrated circuit wafer introduce changes in the geometric size of the projected image on the wafer. The magnification of the alignment system is then adjusted in order to compensate for isotropic changes in the size of the mask and/or the wafer.

However, alignment data from standard X-ray lithographic systems show an additional type of mask distortion which is anisotropic and therefore cannot be corrected by magnification control. This anisotropic distortion is introduced primarily by thermally induced clamping effects which lead to variations in clamping forces in the plane of the mask. Even with careful attention to temperature control it is difficult to entirely eliminate this in-plane clamping distortion.

SUMMARY OF THE INVENTION

In accordance with the illustrated preferred embodiment, the present invention reduces anisotropic distortion caused by in-plane clamping forces. This is accomplished by introducing controlled compensating distortion in the mask during X-ray exposure. The X-ray mask is mounted into the X-ray machine using a set of clamps. These clamps can be moved over a limited range by piezoelectric or other means of actuation. Additional alignment sensors are incorporated in the X-ray mask to measure how much the mask is distorted relative to the wafer at several locations. This information is then used to servo the clamp translators which then move the clamps relative to one another to minimize alignment errors at each sensor location, thus significantly reducing the previously induced distortion.

DETAILED DESCRIPTION OF THE INVENTION

Figure 1:
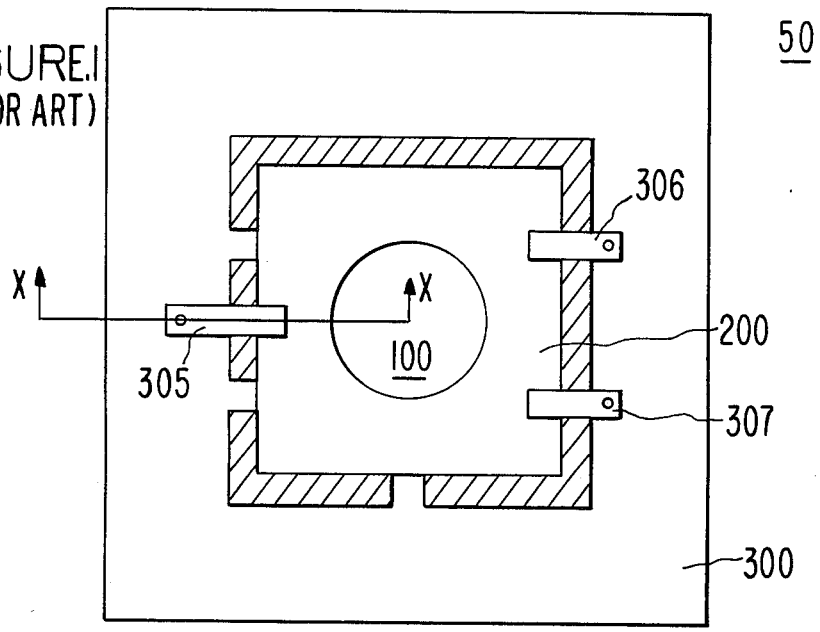
FIG. 1 shows an X-ray mask assembly as illustrated in the prior art.
Figure 2:
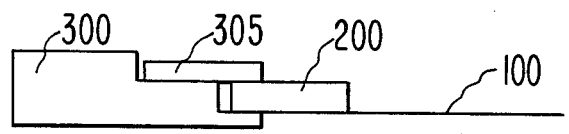
FIG. 2 shows a section through the X-ray mask of the prior art as illustrated in FIG. 1.

FIG. 1 shows an X-ray mask assembly 50 as illustrated in the prior art. A thin X-ray pellicle 100 having a thickness typically in the range of 1 to 5 microns is bonded around its periphery to a support frame 200 using conventional bonding techniques, such as by epoxy bonding. The support frame 200 is then loaded and clamped into cassette 300 using mounting clamps 305, 306, and 307, prior to being patterned in an electron beam machine or used to expose a wafer in an X-ray machine. FIG. 2, shows a section x-x through mounting clamp 305 as illustrated in FIG. 1.

Figure 3:
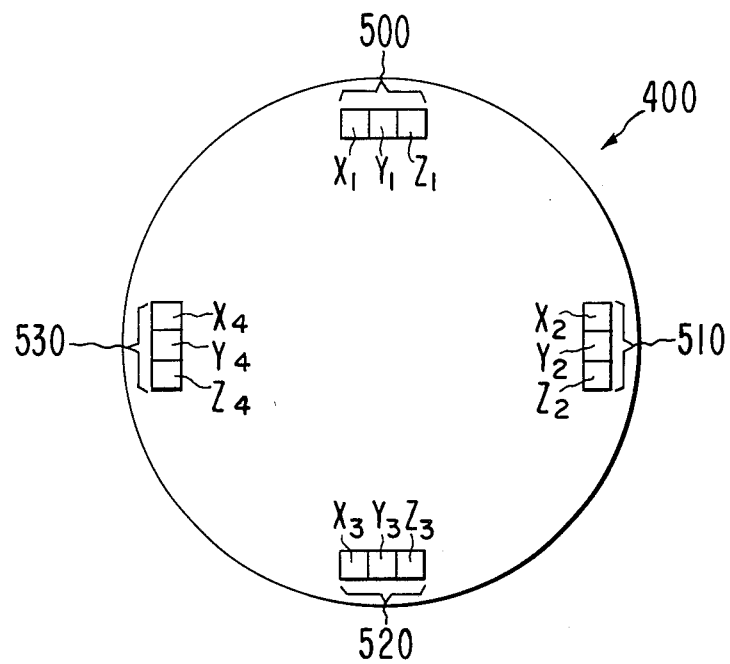
FIG. 3 shows a sensor group arrangement on a wafer according to the preferred embodiment.

FIG. 3 shows an arrangement of alignment pattern groups on a wafer 400 according to the present invention. For best results, alignment pattern groups 500, 510, 520, and 530 are positioned 90 degrees to each other on wafer 400. Alignment pattern group 500 contains $x_1$, $y_1$, and $z_1$ alignment patterns. Alignment pattern group 510 contains $x_2$, $y_2$, and $z_2$ alignment patterns. Alignment pattern group 520 contains $x_3$, $y_3$, and $z_3$ alignment patterns. Alignment pattern group 530 contains $x_4$, $y_4$, and $z_4$ alignment patterns. Capacitive alignment sensors of the type described in a patent application entitled "Capacitive Mask Aligner", Ser. No. 541,385, filed Oct. 12, 1983 by Armand Neukermans, are particularly suitable for this application and are used for alignment pattern groups 500, 510, 520, and 530. Matching alignment pattern groups, such as 510' located on mask 100' shown in FIG. 5, align with each one of alignment pattern groups 500, 510, 520 and 530 to form alignment sensors for sensing misalignment between the wafer 400 and the mask 100'.

Figure 4:
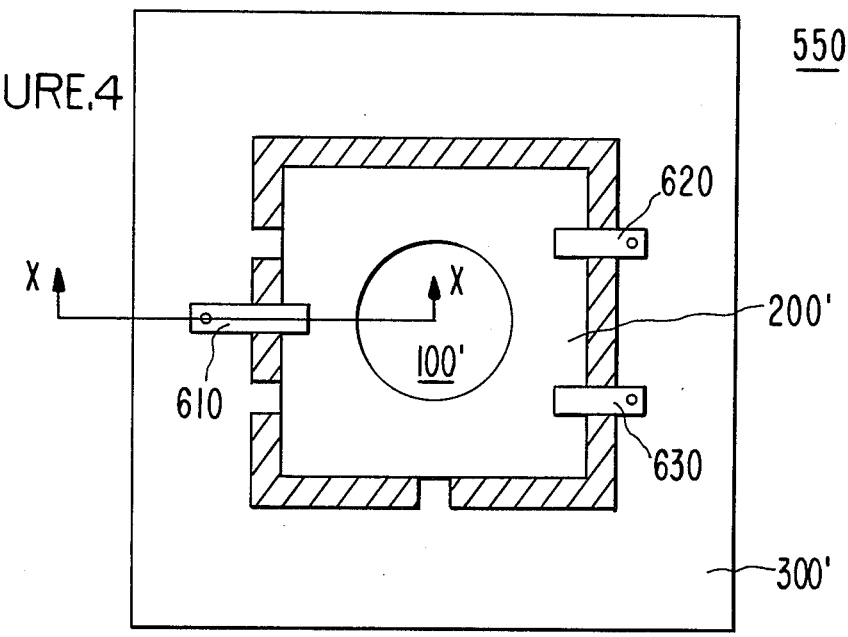
FIG. 4 shows an X-ray mask assembly according to a preferred embodiment of the present invention.

FIG. 4 shows an X-ray mask assembly 550 according to a preferred embodiment of the present invention. A thin X-ray pellicle 100' having a thickness typically in the range of 1 to 5 microns is bonded around its periphery to a support frame 200' using conventional bonding techniques, such as by epoxy bonding. The support frame 200' is then loaded and clamped into cassette 300' using mounting clamps 610, 620, and 630, prior to being patterned in an electron beam machine or used to expose a wafer in an X-ray machine.

Figure 5:
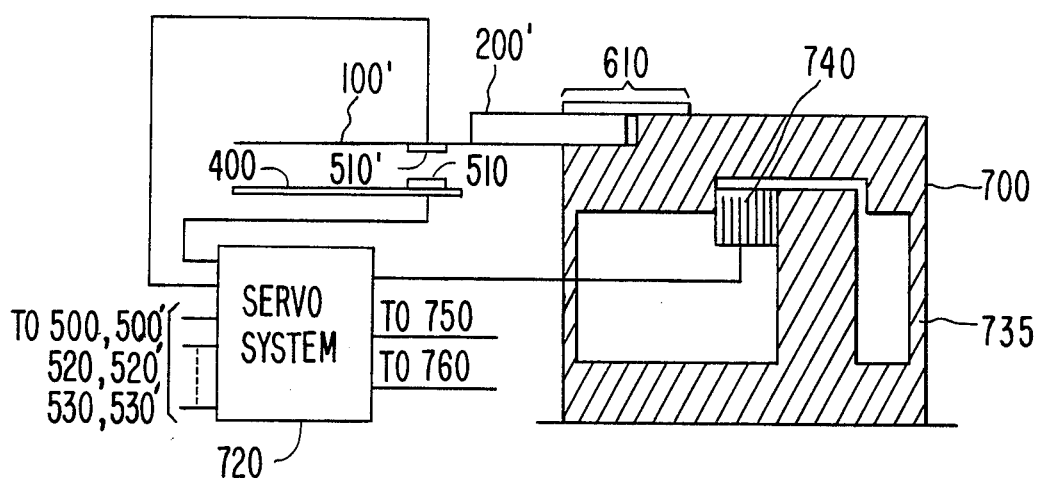
FIG. 5 shows a cross-section of a preferred embodiment of the present invention as illustrated in FIG. 4.

FIG. 5 shows a section x-x through mounting clamp 610 as illustrated in FIG. 4. In operation, pellicle 100' and support frame 200' are loaded and clamped into an actuator/clamp flexure assembly 700. The actuator/clamp flexure assembly 700 is based on a parallel movement flexure pivot as described in an article by R. V. Jones entitled "Some Uses of Elasticity in Instrument Design" published in the Journal of Scientific Instruments, Volume 39, pages 193-203, May 1962. The pellicle 100' is then aligned to the wafer in six degrees of freedom in a manner, for example, as described in a patent application entitled "Flexure Stage Alignment Apparatus", Ser. No. 564,434, filed Dec. 21, 1983 by Graham Siddall. Six sensors, three in x and y positions, and three in z positions (e.g., $x_1$, $x_3$, $y_2$, $z_1$, $z_2$, and $z_3$) are required to perform this alignment. The remaining six sensors, $x_2$, $y_1$, $x_4$, $y_3$, $y_4$, and $z_4$, provide misalignment information and of these, five, $x_2$, $y_1$, $x_4$, $y_3$, and $y_4$, provide localized x, y misalignment data. For example, the two sensor pairs $x_2$, $x_4$ and $y_1$, $y_3$ provide data on the isotropic scale changes in x and y between the mask assembly 50 and the wafer 400. This information is then used to servo the mask/wafer gap to correct for isotropic distortion. The anisotropic distortion is measured by the residual relative misalignment between $x_2$, $y_1$, $x_4$, $y_3$, $y_4$ and the $x_1$, $x_3$ and $y_2$ sensors. The signals from these sensors used to measure anisotropic distortion are connected to a servo system 720 which provides feedback information to piezoelectric actuators 740, 750 (not shown), and 760 (not shown) which are connected to clamps 610, 620, and 630, respectively. Piezoelectric actuators 740, 750, and 760 subsequently move the translating mounting clamps 610, 620, and 630 relative to one another to reduce the misalignment between the mask assembly 50 and the wafer 400. Generally it is not possible to distort the mask to provide perfect alignment at each sensor. Instead, the mask is distorted in such a way to minimize the x, y misalignment to, for example, a least squares error criterion as described by Mary Gibbons Natrella, in an article entitled "Experimental Statistics", published in the National Bureau of Standards Handbook 91, Washington: US Government Printing Office, 1963, Chapter 6. The alignment accuracy is significantly improved resulting in an increase in the useable exposure field diameter by at least 2 to 3 times. Furthermore, as the useable field diameter is increased the useable wafer area per exposure is increased and this increases the device production throughput.

What is claimed is:

1. A mask aligner for use with a mask and a wafer comprising:
   clamping means having at least three clamping members for clamping said mask into an X-ray stage and positioning said mask at an initial position;
   electromechanical means connected to said clamping means for moving said clamping members laterally in the plane of said mask relative to one another and distorting said mask relative to said wafer;
   sensor means for sensing the distortion of the mask relative to the wafer and for producing a corresponding distortion signal; and
   feedback means for accepting said corresponding distortion signal and for providing a signal to said electromechanical means so as to reduce in-plane distortion of said mask relative to said wafer.

2. A mask aligner as in claim 1 wherein said sensor means comprises:
   a first plurality of six alignment patterns on a first surface of said wafer;
   a second plurality of alignment patterns on said first surface of said wafer;
   a third plurality of six alignment patterns on a second surface of said mask; and
   a fourth plurality of alignment patterns on said second surface of said mask, said first and third plurality of six alignment patterns providing isotropic alignment data between said wafer and said mask, respectively, and said second and fourth plurality of alignment patterns providing localized misalignment data between said wafer and said mask respectively.

3. A mask aligner as in claim 2 wherein said second and fourth plurality of alignment patterns each comprise four or more alignment patterns.

4. A mask aligner as in claim 1 wherein said electromechanical means comprises:
   a plurality of flexures each having an actuator, said flexures being connected to said clamping members.

5. Apparatus for improving mask-to-wafer alignment by reducing in-plane mask distortion, comprising:
   clamping means for peripheral clamping of a mask in an initial position in generally parallel alignment with a wafer;
   sensor means for sensing undesired in-plane distortion of the mask relative to the wafer and providing a distortion signal representative thereof; and
   translation means for moving at least three points on the periphery of said mask laterally in the mask plane and relatively to each other in response to said distortion signal so as to produce a desired in-plane mask distortion relative to said initial position and improve mask-to-wafer alignment.

6. Apparatus as defined in claim 5 wherein said clamping means comprises at least three clamping members for peripheral clamping of the mask and said translation means comprises means for individually translating each of said clamping members.

7. Apparatus as defined in claim 6 wherein said translation means includes a piezoelectric actuator coupled to each of said clamping members and feedback means for providing an actuating signal to each piezoelectric actuator in response to said distortion signal.

8. Apparatus as defined in claim 7 wherein said sensor means comprises a first plurality of alignment patterns located at different positions on said wafer and a second plurality of alignment patterns on said mask in nominal alignment with said first plurality of alignment patterns.

9. A method for improving mask-to-wafer alignment by reducing in-plane mask distortion, comprising the steps of:
   clamping a mask at its periphery in an initial position in generally parallel alignment with a wafer;
   sensing undesired in-plane distortion of the mask relative to the wafer and providing a distortion signal representative of said undesired in-plane distortion; and
   moving at least three points on the periphery of said mask laterally in the mask plane and relatively to each other in response to said distortion signal so as to produce a desired in-plane mask distortion relative to said initial position and improve mask-to-wafer alignment.

10. The method as defined in claim 9 wherein said step of clamping includes clamping said mask with at least three peripheral clamping members and wherein said step of moving includes individually translating said clamping members relatively to each other.

* * * * *